(12) United States Patent
Tsuji

(10) Patent No.: US 11,128,256 B2
(45) Date of Patent: Sep. 21, 2021

(54) OSCILLATOR CIRCUIT

(71) Applicant: ROHM CO., LTD., Kyoto (JP)

(72) Inventor: Masanobu Tsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/832,562

(22) Filed: Mar. 27, 2020

(65) Prior Publication Data

US 2020/0313616 A1 Oct. 1, 2020

(30) Foreign Application Priority Data

Mar. 29, 2019 (JP) .............................. JP2019-066509

(51) Int. Cl.
| | |
|---|---|
| H03B 5/12 | (2006.01) |
| H03L 7/099 | (2006.01) |
| G01R 19/165 | (2006.01) |
| H03K 5/24 | (2006.01) |
| H02M 3/07 | (2006.01) |
| G01R 23/09 | (2006.01) |

(52) U.S. Cl.
CPC ..... *H03B 5/1228* (2013.01); *G01R 19/16528* (2013.01); *G01R 23/09* (2013.01); *H02M 3/07* (2013.01); *H03B 5/1206* (2013.01); *H03B 5/1253* (2013.01); *H03K 5/24* (2013.01); *H03L 7/0992* (2013.01); *H03B 2200/006* (2013.01); *H03B 2200/0038* (2013.01)

(58) Field of Classification Search
CPC .. H03B 5/1222; H03B 5/1253; H03B 5/1206; H03B 2200/006; H03B 2200/0038; H03B 2200/0052; H03B 2200/005; H03L 7/091; H03L 7/0992
See application file for complete search history.

(56) References Cited

U.S. PATENT DOCUMENTS 8,860,517 B2 * 10/2014 Giacomini ............. H03K 3/011
                                                              331/111
9,444,468 B2 *  9/2016 Astrom ..................... H03L 7/02
(Continued)

OTHER PUBLICATIONS

K. Lasanen, E. Raisanen-Ruotsalainen, J. Kostamovaara, "A 1-V, Self Adjusting, 5-MHz CMOS RC-Oscillator", 2002 IEEE International Symposium on Circuits and Systems. Proceedings (Cat. No. 02CH37353), Phoenix-Scottsdale, AZ, USA, 2002, pp. IV-IV.
(Continued)

*Primary Examiner* — Jeffrey M Shin
(74) *Attorney, Agent, or Firm* — Cantor Colburn LLP

(57) ABSTRACT

A frequency variable oscillator generates a clock having a frequency according to a control signal. A reference current source generates a reference current. A path selector distributes the reference current to a first path and a second path in a time-sharing manner in synchronization with the clock. An F/V conversion circuit includes a capacitor connected to the first path, and charges or discharges the capacitor with the reference current and generates a detection voltage. The reference voltage source includes a resistor connected to the second path, and outputs a reference voltage according to a voltage across the resistor. A feedback circuit adjusts a control signal so that the detection voltage approaches the reference voltage.

10 Claims, 9 Drawing Sheets

(56) References Cited

U.S. PATENT DOCUMENTS

2013/0200956 A1* 8/2013 Hsiao .................. H03K 4/502
 331/111
2014/0320216 A1* 10/2014 Wang .................. H03L 7/00
 331/25

OTHER PUBLICATIONS

Ken Ueno, Tetsuya Asai, Yoshihito Amemiya, "A 30-MHz, 90-ppm/°C. Fully-integrated Clock Reference Generator with Frequency-locked Loop", 2009 Proceedings of ESSCIRC, Athens, 2009, pp. 392-395.

Myungjoon Choi, Suyoung Bang, Tae-Kwang Jang, David Blaauw, Dennis Sylvester, "A 99nW 70.4kHz Resistive Frequency Locking On-Chip Oscillator with 27.4ppm/°C. Temperature Stability", 2015 Symposium on VLSI Circuits (VLSI Circuits), Kyoto, 2015, pp. C238-C239.

Myungjoon Choi, Taekwang Jang, Suyoung Bang, Yao Shi, David Blaauw, Dennis Sylvester, "A 110nW Resistive Frequency Locked On-Chip Oscillator with 34.3ppm/°C. Temperature Stability for System-on-Chip Designs", IEEE Journal of Solid-State Circuits, vol. 51, No. 9, pp. 2106-2118, Sep. 2016.

Timothy O'Shaughnessy, "A CMOS, self calibrating, 100 MHz RC-oscillator for ASIC applications", Proceedings of Eighth International Application Specific Integrated Circuits Conference, Austin, TX, USA, 1995, pp. 279-282.

* cited by examiner

OSCILLATOR CIRCUIT

CROSS REFERENCE TO RELATED APPLICATIONS

The present invention claims priority under 35 U.S.C. § 119 to Japanese Application No. 2019-066509 filed Mar. 29, 2019, the entire content of which is incorporated herein by reference.

BACKGROUND OF THE INVENTION

1. Field of the Invention

The present invention relates to an oscillator circuit that can be integrated on a semiconductor chip.

2. Description of the Related Art

Digital circuits and frequency synthesizers require a reference clock for operations thereof. An oscillator is used to generate the reference clock. As the oscillator, there are an oscillator using crystal, ceramic, and micro electro mechanical systems (MEMS), an LC oscillator, a CR oscillator, a ring oscillator, a multi-vibrator, a relaxation oscillator, and the like.

The oscillator using crystal, ceramic, and MEMS can obtain a high-accuracy clock frequency, but cannot be manufactured by standard semiconductor processes. For this reason, it is necessary to add an external oscillator, which causes a cost increase.

The CR oscillator, the LC oscillator, the ring oscillator, the multi-vibrator, or the relaxation oscillator is used to integrate the oscillator on the semiconductor chip. However, since an oscillation frequency depends on manufacturing variations, temperature fluctuations, and voltage fluctuations, it is difficult to obtain high frequency stability accuracy.

A feedback loop type oscillator is proposed as a relatively high-accuracy oscillator that can be integrated on the semiconductor chip. FIG. 1 is a block diagram of the feedback loop type oscillator. A feedback loop type oscillator 30 includes a voltage controlled oscillator (VCO) 44, a frequency divider 34, a frequency-voltage (F/V) conversion circuit 36, a reference voltage source 38, an error amplifier 40, and a filter 42.

The voltage controlled oscillator 44 oscillates at a frequency according to a control voltage $V_{CTRL}$. The frequency divider 34 divides an output clock CLKOSC of the voltage controlled oscillator 44 by 1/N. The F/V conversion circuit 36 can be grasped as a switched capacitor circuit including a capacitor C and a switch SW. Since the switched capacitor circuit has an equivalent resistance of $1/(C \times f_{SW})$, a reference current $I_{REF1}$ flows through the equivalent resistance, so that a detection voltage $V_C$ of Formula (1) is generated.

$$V_C \propto I_{REF1}/(C \times f_{SW}) \quad (1)$$

The detection voltage $V_C$ is inversely proportional to the capacitor C and a switching frequency $f_{SW}$ (that is, a frequency $f_{DIV}$ of a divided clock), and is proportional to the reference current $I_{REF1}$.

The reference voltage source 38 includes a resistor R, and generates a reference voltage $V_R$ proportional to the resistor R and the reference current $I_{REF2}$.

$$V_R \propto I_{REF2} \times R \quad (2)$$

The error amplifier (comparator) 40 amplifies an error between the reference voltage $V_R$ and the detection voltage $V_C$. The filter 42 smooths an output of the error amplifier 40 and generates a control voltage $V_{CTRL}$.

According to the feedback loop type oscillator 30, feedback is applied so that $V_C = V_R$ is satisfied, in other words, Formula (3) is satisfied.

$$I_{REF1}/(C \times f_{DIV}) = I_{REF} \times R \quad (3)$$

Therefore, when $I_{REF1} = I_{REF2}$ is satisfied, after a feedback loop is stabilized, a frequency $f_{DIV}$ of a divided clock CLKDIV and a frequency $f_{OSC}$ of an oscillator clock CLKOSC are given by Formulas (4) and (5), respectively.

$$f_{DIV} = 1/CR \quad (4)$$

$$f_{OSC} = N \times f_{DIV} = N/CR \quad (5)$$

The present inventors have examined the feedback loop type oscillator 30 of FIG. 1 and have come to recognize the following problems.

In the feedback loop type oscillator 30 of FIG. 1, the reference current $I_{REF1}$ used in the F/V conversion circuit 36 and the reference current $I_{REF2}$ used in the reference voltage source 38 are generated by copying a reference current $I_{REF1}$ generated by a reference current source 39 by a current mirror circuit. However, if a mirror ratio of the current mirror circuit varies or fluctuates, $I_{REF1} \neq I_{REF2}$ is obtained, and the clock frequency $f_{DIV}$ changes to Formula (6).

$$f_{DIV} = 1/CR \times I_{REF1}/I_{REF2} \quad (6)$$

Since the error between the two reference currents $I_{REF1}$ and $I_{REF2}$ is affected by process variations, temperature fluctuations, and power supply voltage fluctuations, the error degrades frequency stability accuracy of the feedback loop type oscillator 30. The above problems should not be taken as a general perception of those skilled in the art.

SUMMARY OF THE INVENTION

The present invention has been made in view of the above problems, and one of exemplary general purposes of one embodiment thereof is to provide an oscillator circuit with improved frequency stability accuracy.

One embodiment of the present invention relates to an oscillator circuit. The oscillator circuit includes: a frequency variable oscillator structured to generate a clock of a frequency according to a control signal; a reference current source structured to generate a reference current; a path selector structured to distribute the reference current to a first path and a second path in a time-sharing manner in synchronization with the clock; an F/V conversion circuit including a capacitor connected to the first path, and structured to charge/discharge the capacitor with the reference current and generate a detection voltage; a reference voltage source including a resistor connected to the second path and structured to output a reference voltage according to a voltage across the resistor; and a feedback circuit structured to adjust a control signal so that the detection voltage approaches the reference voltage It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
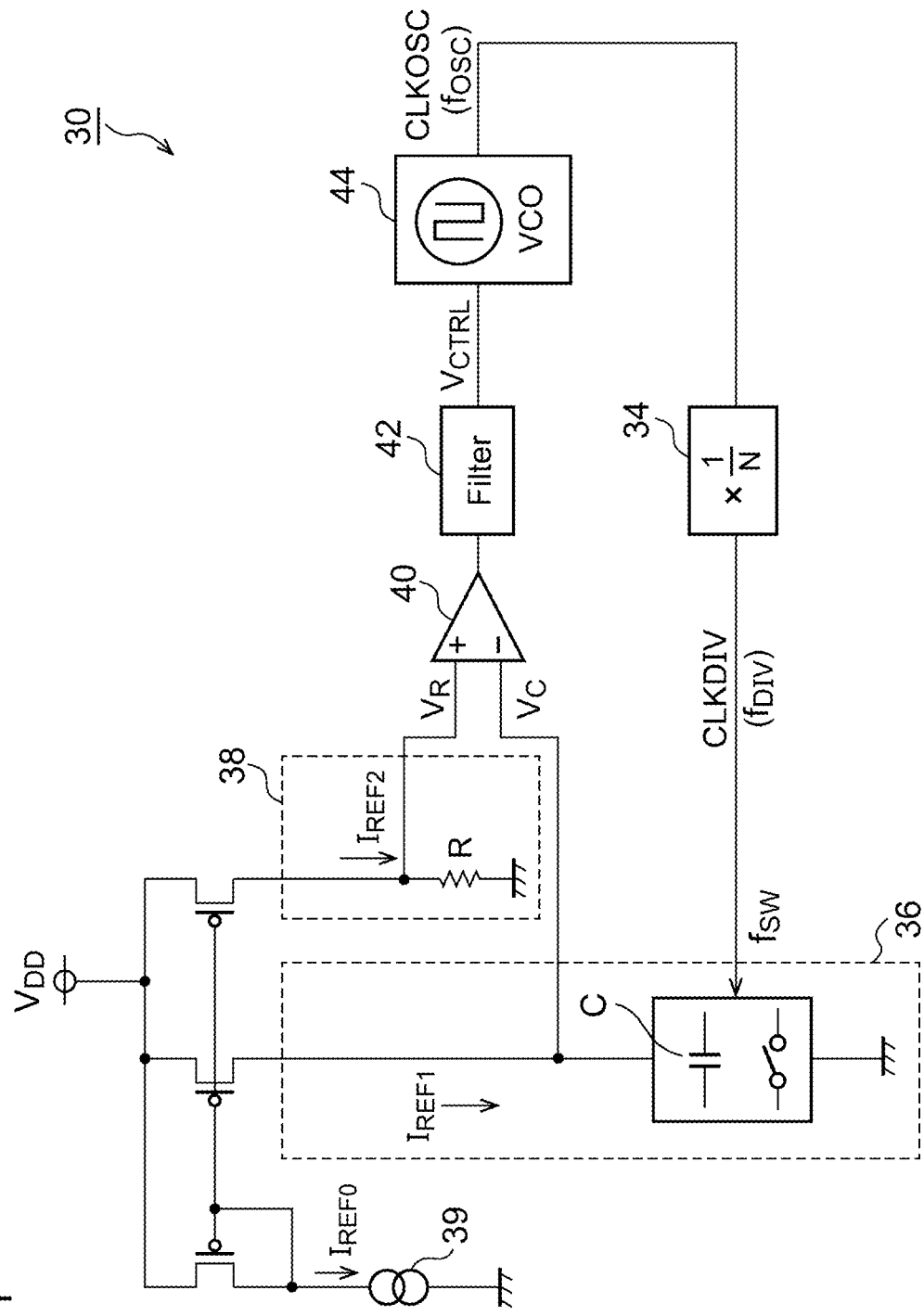
FIG. 1 is a circuit diagram of a feedback loop type oscillator.

The invention will now be described based on preferred embodiments which do not intend to limit the scope of the present invention but exemplify the invention. All of the features and the combinations thereof described in the embodiment are not necessarily essential to the invention.

Outline of Embodiment

One embodiment disclosed in the present specification relates to an oscillator circuit. The oscillator circuit includes: a frequency variable oscillator structured to generate a clock having a frequency according to a control signal; a reference current source structured to generate a reference current; a path selector structured to distribute the reference current to a first path and a second path in a time-sharing manner in synchronization with the clock; an F/V conversion circuit including a capacitor connected to the first path and structured to charge or discharge the capacitor with the reference current and generate a detection voltage; a reference voltage source including a resistor connected to the second path and structured to generate a reference voltage according to a voltage across the resistor; and a feedback circuit structured to adjust a control signal so that the detection voltage approaches the reference voltage.

According to the embodiment, by generating the reference voltage and the detection voltage in a time-sharing manner on the basis of a reference current generated by a common current source, a problem that occurs when two reference currents are used can be solved, and a clock with high frequency accuracy can be generated.

The feedback circuit may include an error amplifier having an offset cancellation mechanism by clock control, or a clocked comparator that compares the reference voltage and the detection voltage in synchronization with the clock. By using a comparator that operates discontinuously in time, it is possible to preferably compare the detection voltage and the reference voltage generated in a time-sharing manner.

In a system using the error amplifier, a system offset occurs due to finite gain of the amplifier. By using the clocked comparator instead of the error amplifier and forming a complete integration type system similar to a charge pump type PLL circuit, DC gain can be made infinite, and the system offset can be eliminated theoretically.

The frequency variable oscillator may be a voltage controlled oscillator. The feedback circuit may further include a charge pump controlled by an up signal and a down signal according to an output of the clocked comparator.

The frequency variable oscillator may be a digitally controlled oscillator, and the feedback circuit may further include an up/down counter controlled by an up signal and a down signal according to an output of the clocked comparator.

The oscillator circuit may further include a timing generator structured to control the clocked comparator and the path selector on the basis of the clock.

The frequency oscillator may further include a dummy current source structured to supply a dummy reference current to the second path during a period where the path selector distributes the reference current to the first path. Thereby, a voltage level of the reference voltage can be kept substantially constant during one clock cycle, and a settling time of the reference voltage can be reduced.

The capacitor may include a variable capacitor controlled according to a control code. The oscillator circuit may further include a frequency locked loop (FLL) circuit structured to generate a control code so that the frequency of the clock approaches a frequency of a reference clock input from the outside; and a memory structured to hold the control code in a state where the FLL circuit is locked, in a non-volatile manner. Thereby, it is possible to absorb a process variation of a capacitor or a reference resistor, and to further improve frequency accuracy.

Embodiment

Hereinafter, the present invention will be described on the basis of preferred embodiments while referring to the drawings. The same or equivalent components, members, and processes illustrated in the drawings will be denoted by the same reference numerals, and repeated description will be omitted as appropriate. Further, the embodiments do not limit the invention, but are exemplary, and all features and combinations thereof described in the embodiments are not necessarily essential to the invention.

In the present specification, a "state where a member A is connected to a member B" includes not only a case where the member A and the member B are directly connected physically but also a case where the member A and the member B are indirectly connected via another member that does not substantially affect an electrical connection state or does not impair a function and an effect provided by connection.

Similarly, a "state where a member C is provided between the members A and B" includes not only a case where the members A and C or the members B and C are directly connected but also a case where the members A and C or the members B and C are indirectly connected via another member that does not substantially affect an electrical connection state or does not impair a function and an effect provided by connection.

Figure 2:
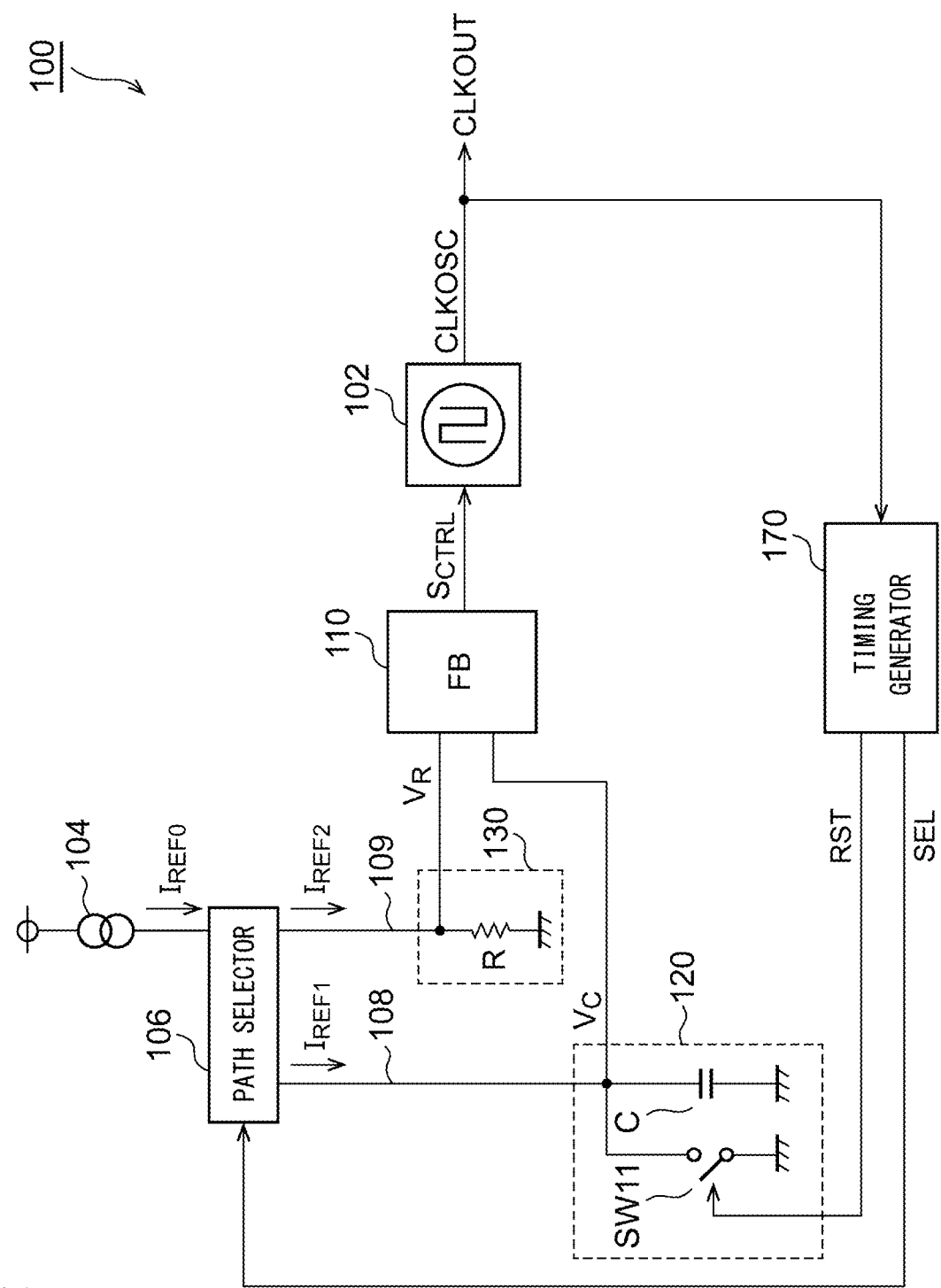
FIG. 2 is a circuit diagram of an oscillator circuit according to an embodiment.

FIG. 2 is a circuit diagram of an oscillator circuit 100 according to an embodiment. The oscillator circuit 100 generates an output clock CLKOUT having a frequency $f_{OUT}$ determined according to a resistor R and a capacitor C. The oscillator circuit 100 includes a frequency variable oscillator 102, a reference current source 104, a path selector 106, a frequency-voltage (F/V) conversion circuit 120, a reference voltage source 130, a feedback circuit 110, and a timing generator 170, and is integrated on one semiconductor substrate.

The frequency variable oscillator 102 generates an oscillator clock CLKOSC having a frequency $f_{OSC}$ according to a control signal $S_{CTRL}$. As described later, the frequency variable oscillator 102 may be a voltage controlled oscillator (VCO) or a digital controlled oscillator (DCO), and its circuit type is not limited. In the present embodiment, the oscillator clock CLKOSC is extracted as the output CLKOUT of the oscillator circuit 100.

The reference current source 104 generates a reference current $I_{REF0}$. The path selector 106 distributes the reference current $I_{REF0}$ to a first path 108 and a second path 109 in a time-sharing manner, according to a selection signal SEL generated on the basis of the oscillator clock CLKOSC. A reference current $I_{REF1}$ flowing through the first path 108 and a reference current $I_{REF2}$ flowing through the second path 109 are both equal to the reference current $I_{REF0}$.

$$I_{REF1} = I_{REF2} = I_{REF0}$$

The path selector 106 may select the first path 108 for a charging time $T_{CHG}$ (for example, two cycles of four consecutive cycles) proportional to a cycle of the oscillator clock CLKOSC.

The F/V conversion circuit 120 includes a capacitor C connected to first path 108. The F/V conversion circuit 120 charges the capacitor C with the reference current $I_{REF1}$ flowing through the first path 108, and generates a detection voltage $V_C$. The capacitor C is charged for the charging time $T_{CHG}$ during which the reference current $I_{REF1}$ is supplied from the path selector 106.

An initialization switch SW11 is connected in parallel with the capacitor C. The initialization switch SW11 is controlled according to a reset signal RST. The initialization switch SW11 is turned on before starting charging, and initializes the charge of the capacitor C, that is, the detection voltage $V_C$ in each operation cycle. The initialization switch SW11 is turned off for the charging time $T_{CHG}$.

After the elapse of the charging time, the detection voltage $V_C$ across the capacitor C is represented by Formula (7).

$$V_C = I_{REF1} \times T_{CHG}/C = I_{REF0} \times T_{CHG}/C \quad (7)$$

The reference voltage source 130 includes a resistor R connected to the second path 109, and outputs a reference voltage $V_R$ according to a voltage across the resistor R due to the reference current $I_{REF2}$ flowing through the second path 109.

$$V_{REF} = I_{REF2} \times R = I_{REF0} \times R \quad (8)$$

The feedback circuit 110 adjusts the control signal $S_{CTRL}$ so that the detection voltage $V_C$ of Formula (7) approaches the reference voltage $V_R$. In a steady state, since the detection voltage $V_C$ of Formula (7) is equal to the reference voltage $V_R$ of Formula (8), Formula (9) is obtained.

$$1/T_{CHG} = 1/CR \quad (9)$$

The charging time $T_{CHG}$ is proportional to a cycle of the oscillator clock CLKOSC (inversely proportional to the oscillation frequency $f_{OSC}$), and is represented by Formula (10) using a constant A.

$$T_{CHG} = A/f_{OSC} \quad (10)$$

From Formulas (9) and (10), the frequency $f_{OSC}$ of the oscillator clock CLKOSC is stabilized to a value of Formula (11).

$$f_{OSC} = A/CR \quad (11)$$

The timing generator 170 generates a SEL signal and an RST signal on the basis of the oscillator clock CLKOSC. For example, the timing generator 170 may generate the SEL signal and the RST signal by dividing the frequency of the oscillator clock CLKOSC (or a divided clock CLKDIV) and performing a logical operation on the divided clock.

The above is a basic configuration of the oscillator circuit 100. According to the oscillator circuit 100, it is guaranteed that the reference current $I_{REF1}$ supplied to the F/V conversion circuit 120 is equal to the reference current $I_{REF2}$ supplied to the reference voltage source 130. Therefore, theoretically, no error occurs between the reference currents $I_{REF1}$ and $I_{REF2}$, and a high-accuracy clock can be generated. Subsequently, more specific embodiments will be described.

Figure 3:
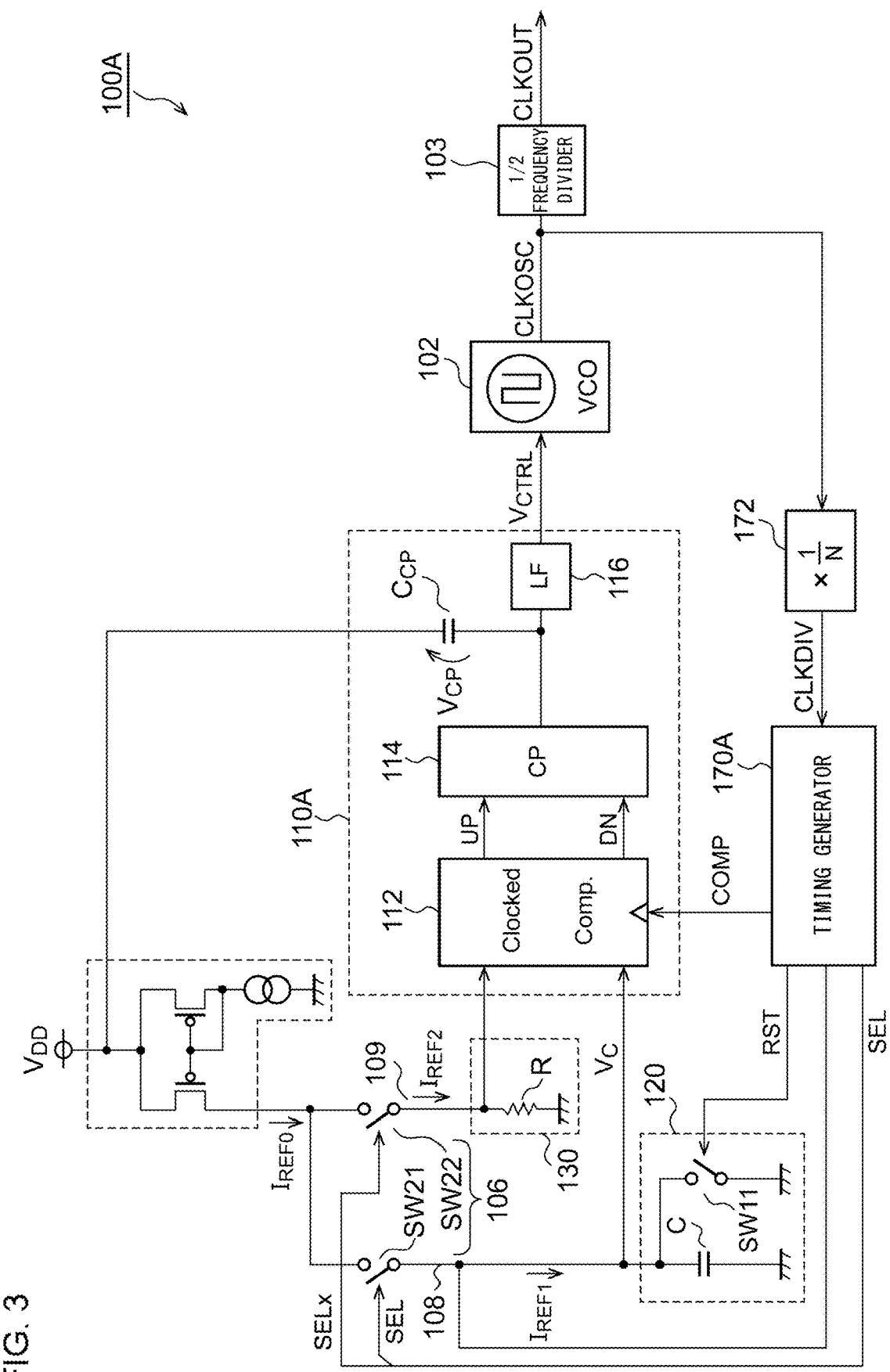
FIG. 3 is a circuit diagram of an oscillator circuit according to a first embodiment.

FIG. 3 is a circuit diagram of an oscillator circuit 100A according to a first embodiment. In this embodiment, the frequency variable oscillator 102 is a VCO. The path selector 106 includes a first switch SW21 and a second switch SW22 that are exclusively turned on. The first switch SW21 and the second switch SW22 are controlled complementarily according to the SEL signal and its inverted signal SELx.

The oscillator circuit 100A includes a ½ frequency divider 103. The ½ frequency divider 103 divides a frequency of an oscillator clock CLKOSC by ½, and generates an output clock CLKOUT.

A feedback circuit 110A includes a clocked comparator 112, a charge pump 114, and a loop filter 116. The clocked comparator 112 compares the reference voltage $V_R$ and the detection voltage $V_C$ in synchronization with a timing signal (COMP signal) based on the output clock CLKOSC. The output of the clocked comparator 112 is converted into an up (UP) signal and a down (DN) signal.

The charge pump 114 charges/discharges a capacitor $C_{CP}$ according to the UP signal/DN signal. A voltage $V_{CP}$ of the capacitor $C_{CP}$ is supplied as the control voltage $V_{CTR}$ to the VCO to be the frequency variable oscillator 102 via the loop filter 116. Since the capacitor $C_{CP}$ itself functions as a filter, the loop filter 116 can be eliminated when a fluctuation of the voltage $V_{CP}$ has a sufficiently small effect on a fluctuation of a frequency of the VCO.

A timing generator 170A generates a SEL signal, an RST signal, and a COMP signal, on the basis of the oscillator clock CLKOSC. Note that a frequency divider 172 corresponding to the frequency divider 4 in FIG. 1 may be provided in a front stage of the timing generator 170A. In this case, the timing generator 170A generates timing signals SEL, RST, and COMP on the basis of the clock CLKDIV after the frequency division. The frequency $f_{OSC}$ of the oscillator clock CLKOSC is scaled according to a frequency division ratio N.

Figure 4:
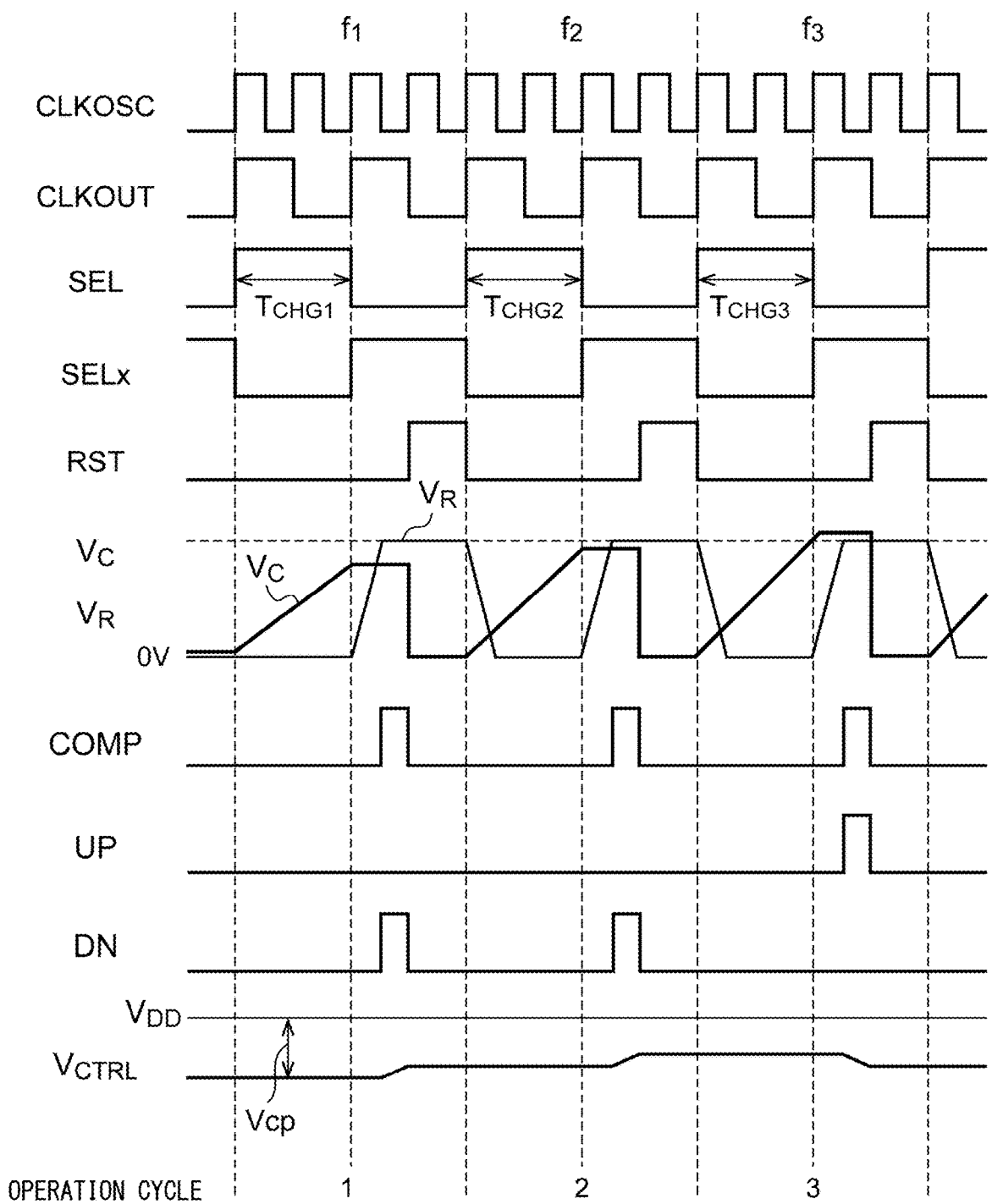
FIG. 4 is an operation waveform diagram of the oscillator circuit of FIG. 3.

Subsequently, an exemplary operation will be described. FIG. 4 is an operation waveform diagram of the oscillator circuit 100A of FIG. 3. FIG. 4 illustrates waveforms in three consecutive operation cycles, and $f_1$, $f_2$, and $f_3$ represent the frequency $f_{OSC}$ of the oscillator clock CLKOSC in the first, second, and third cycles. The frequency division ratio N of the frequency divider 172 is set as 1.

In this example, the oscillator circuit 100A sets four cycles of the oscillator clock CLKOSC as one operation cycle. Specifically, the SEL signal repeats high and low every two cycles of the four cycles of the oscillator clock CLKOSC. The path selector 106 turns on the first path 108 when the SEL signal is high, and turns on the second path 109 when the SEL signal is low.

Further, in the last cycle of the four cycles of the oscillator clock CLKOSC, the RST signal is asserted (for example, high), and the initialization switch SW11 is turned on.

The first operation cycle is focused on. While the SEL signal is high, the charging time becomes a charging time $T_{CHG1}$, the reference current $I_{REF1}$ is supplied to the capacitor C, and the detection voltage $V_C$ increases. When the SEL signal becomes low, the reference current $I_{REF1}$ becomes zero, and an increase in the detection voltage $V_0$ stops. The detection voltage $V_0$ is held in the capacitor C until the RST signal is asserted. That is, the capacitor C also functions as a sample-and-hold circuit.

When the SEL signal becomes low, the reference current $I_{REF1}$ flows through the reference resistor R, and the reference voltage $V_R$ is generated. After the reference voltage $V_R$ is settled, the COMP signal is asserted (high). In response to the assertion of the COMP signal, the clocked comparator 112 compares the detection voltage $V_C$ and the reference voltage $V_R$. In the first operation cycle, $V_C < V_R$ is obtained, and the DN signal is asserted. In response to the assertion of the DN signal, the charge pump voltage $V_{CP}$ decreases, the control voltage $V_{CTRL}$ increases, and the oscillation frequency $f_2$ of the next operation cycle decreases ($f_1 > f_2$).

The second operation cycle operates similarly. Since the frequency of the clock CLKOSC decreases, a length of high of the SEL signal, that is, a charging time $T_{CHG2}$ increases. Therefore, a peak of the detection voltage $V_C$ becomes higher than that in the previous operation cycle. Then, a voltage comparison is performed according to the COMP signal. Also in this operation cycle, $V_C < V_R$ is obtained, and the DN signal is asserted. In response to the assertion of the DN signal, the charge pump voltage $V_{CP}$ decreases, the control voltage $V_{CTRL}$ increases, and the oscillation frequency $f_3$ of the next operation cycle further decreases ($f_2 > f_3$).

In the third operation cycle, a length of high of the SEL signal, that is, a charging time $T_{CHG3}$ further increases. Therefore, a peak of the detection voltage $V_C$ becomes higher than that in the previous operation cycle. In this operation cycle, $V_R < V_C$ is obtained, and an UP signal is asserted. In response to the assertion of the UP signal, the charge pump voltage $V_{CP}$ increases, the control voltage $V_{CTRL}$ decreases, and the oscillation frequency $f_4$ of the next operation cycle increases. ($f_3 < f_4$)

By repeating the above operation, feedback is applied. In the first embodiment, the charging time $T_{CHG}$ is equal to one cycle of the output clock CLKOUT, and a proportional coefficient A in Formula (10) is 1. Therefore, according to the oscillator circuit 100A of FIG. 3, the output clock CLKOUT having the frequency $f_{OUT}$ represented by the equation (12) can be generated.

$$f_{OUT} = 1/CR \quad (12)$$

The ½ frequency divider 103 may be omitted, and the oscillator clock CLKOSC may be used as the output clock CLKOUT. In that case, A=½ and $f_{OUT}=2/CR$ are obtained. In short, the output clock CLKOUT can be used as the oscillator clock CLKOSC or its divided clock.

The above is the operation of the oscillator circuit 100A. According to the oscillator circuit 100A, by generating the reference voltage $V_R$ and the detection voltage $V_C$ in a time-sharing manner using the reference current $I_{REF0}$ generated by the common current source 104, the problem of variations in the reference currents $I_{REF1}$ and $I_{REF2}$ described with reference to FIG. 1 can be solved, and a clock with high frequency accuracy can be generated.

Further, by using the clocked comparator 112 that operates discontinuously in time, it is possible to preferably compare the detection voltage $V_C$ and the reference voltage $V_R$ generated in a time-sharing manner. In a system using an error amplifier, when a system offset occurs due to finite gain of the amplifier, DC gain can be made infinite by forming a complete integration type system similar to a charge pump type PLL circuit, as illustrated in FIG. 3, and the system offset can be eliminated theoretically.

In addition, in the configuration of FIG. 1, since the current $I_{REF2}$ always flows through the resistor R, wasteful power is constantly consumed. On the other hand, according to the present embodiment, the current $I_{REF0}$ is used in a time-sharing manner, so that it is possible to reduce wasteful power consumption.

Second Embodiment

Figure 5:
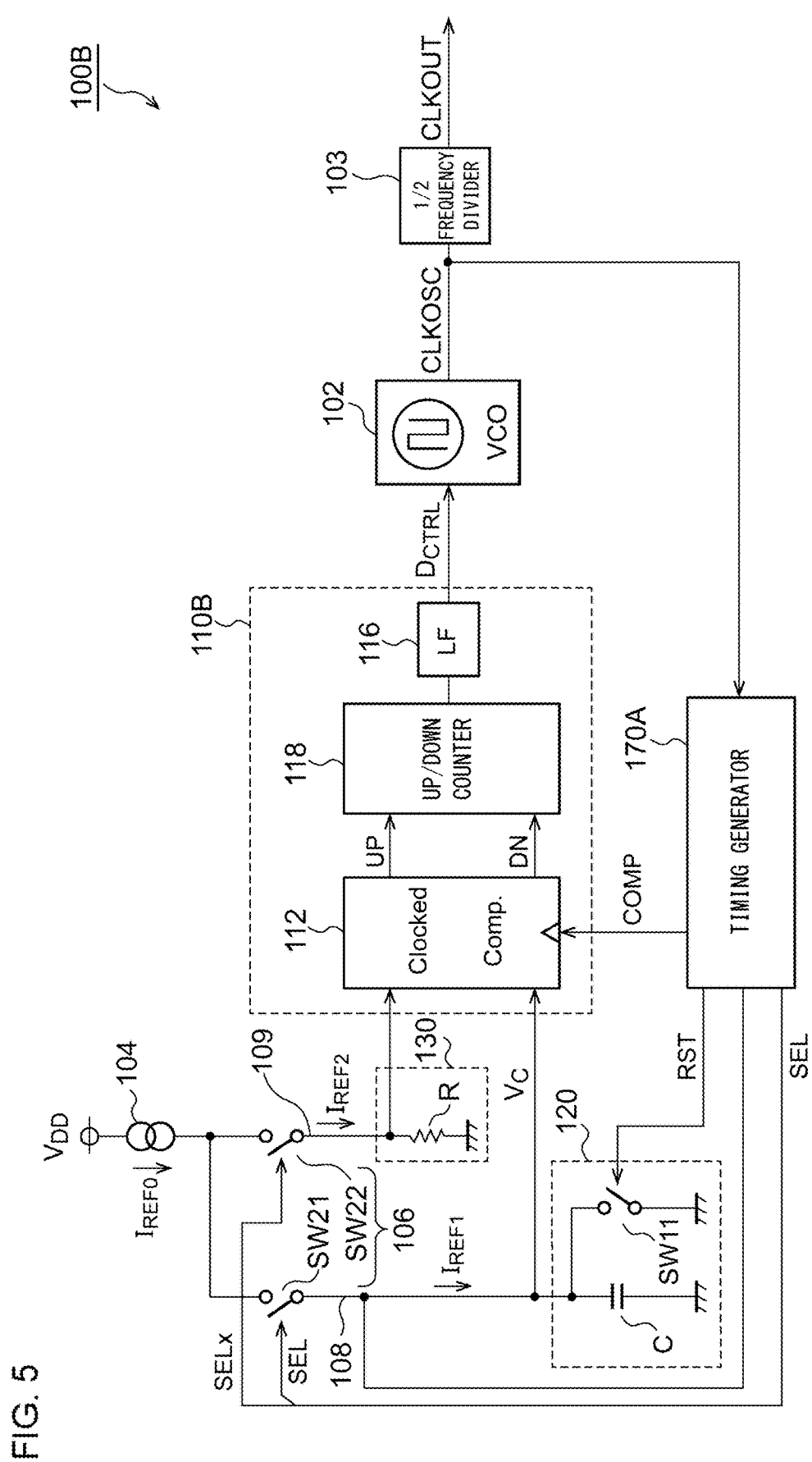
FIG. 5 is a circuit diagram of an oscillator circuit according to a second embodiment.

FIG. 5 is a circuit diagram of an oscillator circuit 100B according to a second embodiment. For a configuration of the oscillator circuit 100B, a difference from the oscillator circuit 100A of FIG. 4 will be described. A frequency variable oscillator 102 is a DCO that oscillates at a frequency according to a control code $D_{CTRL}$. A feedback circuit 110B includes an up/down counter 118 instead of a charge pump 114. The up/down counter 118 counts up/counts down according to an output of a clocked comparator 112, and generates a control code $D_{CTRL}$.

According to the oscillator circuit 100B of FIG. 5, the same effects as those of the oscillator circuit 100A of FIG. 3 can be obtained.

Third Embodiment

In the operation of FIG. 4, a reference voltage $V_R$ decreases to 0 V for a charging time $I_{CHG}$. Since inputs of a second switch SW22, a resistor R, and a clocked comparator 112, and wiring connecting them have parasitic capacitance that cannot be ignored, a delay occurs before the reference voltage $V_R$ returns from 0 V to a normal voltage level. When a frequency $f_{OSC}$ of an oscillator clock CLKOSC increases, the delay may cause a problem in a comparison operation. In the third embodiment, an improvement for solving the above problem will be described.

Figure 6:
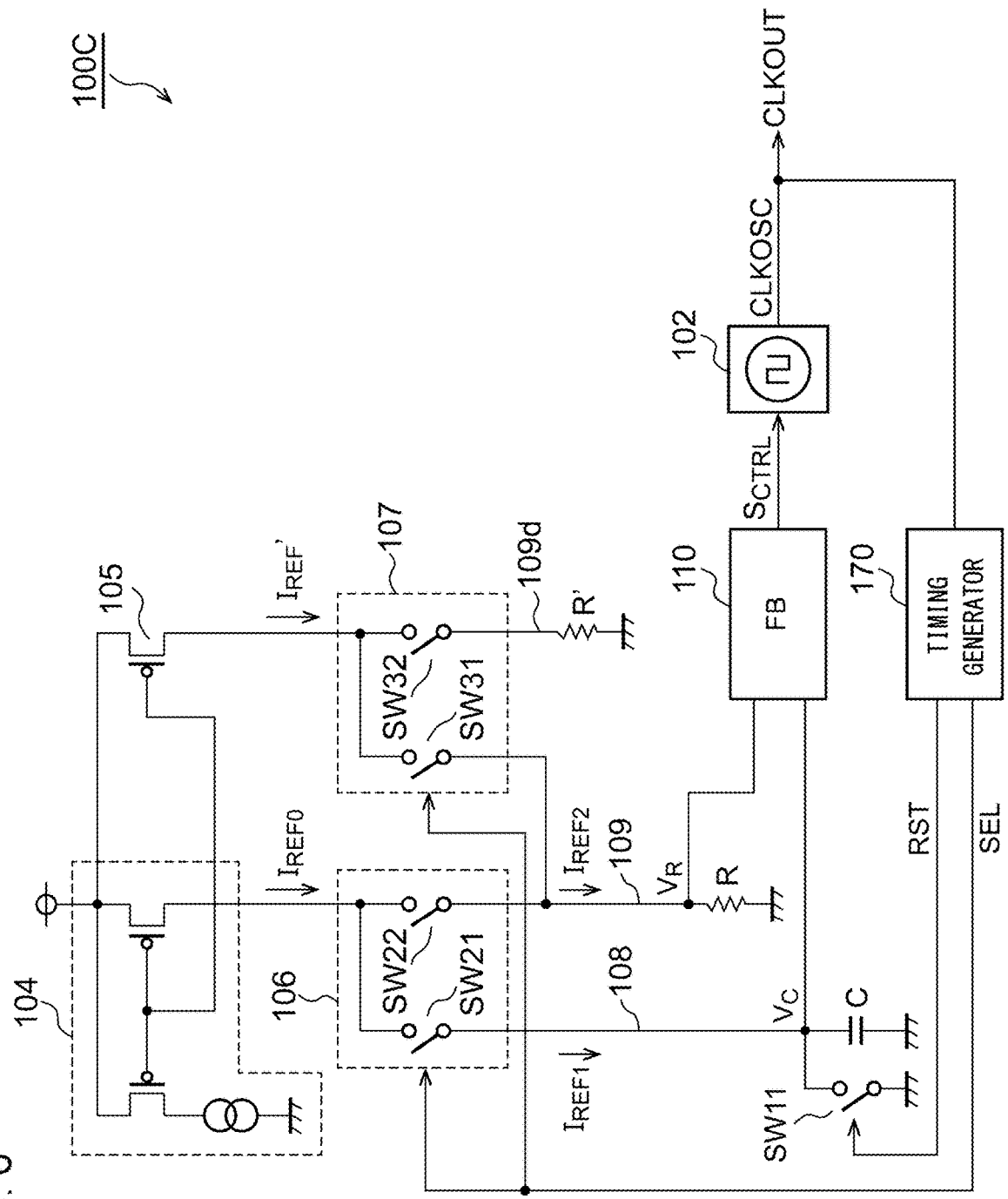
FIG. 6 is a circuit diagram of an oscillator circuit according to a third embodiment.

FIG. 6 is a circuit diagram of an oscillator circuit 100C according to the third embodiment. The oscillator circuit 100C includes a dummy current source 105, a path selector 107, and a dummy resistor R' in addition to the oscillator circuit 100 of FIG. 2.

The dummy current source 105 generates the same amount of dummy current $I_{REF}'$ as a reference current $I_{REF0}$. The path selector 107 is connected to a second path 109 and a third path 109d. The third path 109d may be provided with the dummy resistor R' having a resistance value equal to that of the resistor R. This has an effect of suppressing a voltage fluctuation of each wiring connected to the path selector 107 and returning the reference voltage to the normal voltage level more quickly. However, when the voltage fluctuation can be sufficiently suppressed only by eliminating the dummy current $I_{REF}'$, the dummy resistor R' may be eliminated.

The path selector 107 includes a switch SW31 provided between the dummy current source 105 and the second path 109, and a switch SW32 provided between the dummy current source 105 and the third path 109d. During a period where the path selector 106 distributes the reference current $I_{REF0}$ to the first path 108 (that is, during a charging period $T_{CHG}$), the switch SW31 is turned on, and the dummy current $I_{REF}'$ is supplied to the second path 109. Further, during a period where the path selector 106 distributes the reference current $I_{REF0}$ to the second path 109, the switch SW32 is turned on, and the dummy current $I_{REF}'$ is supplied to the third path 109d.

Figure 7:
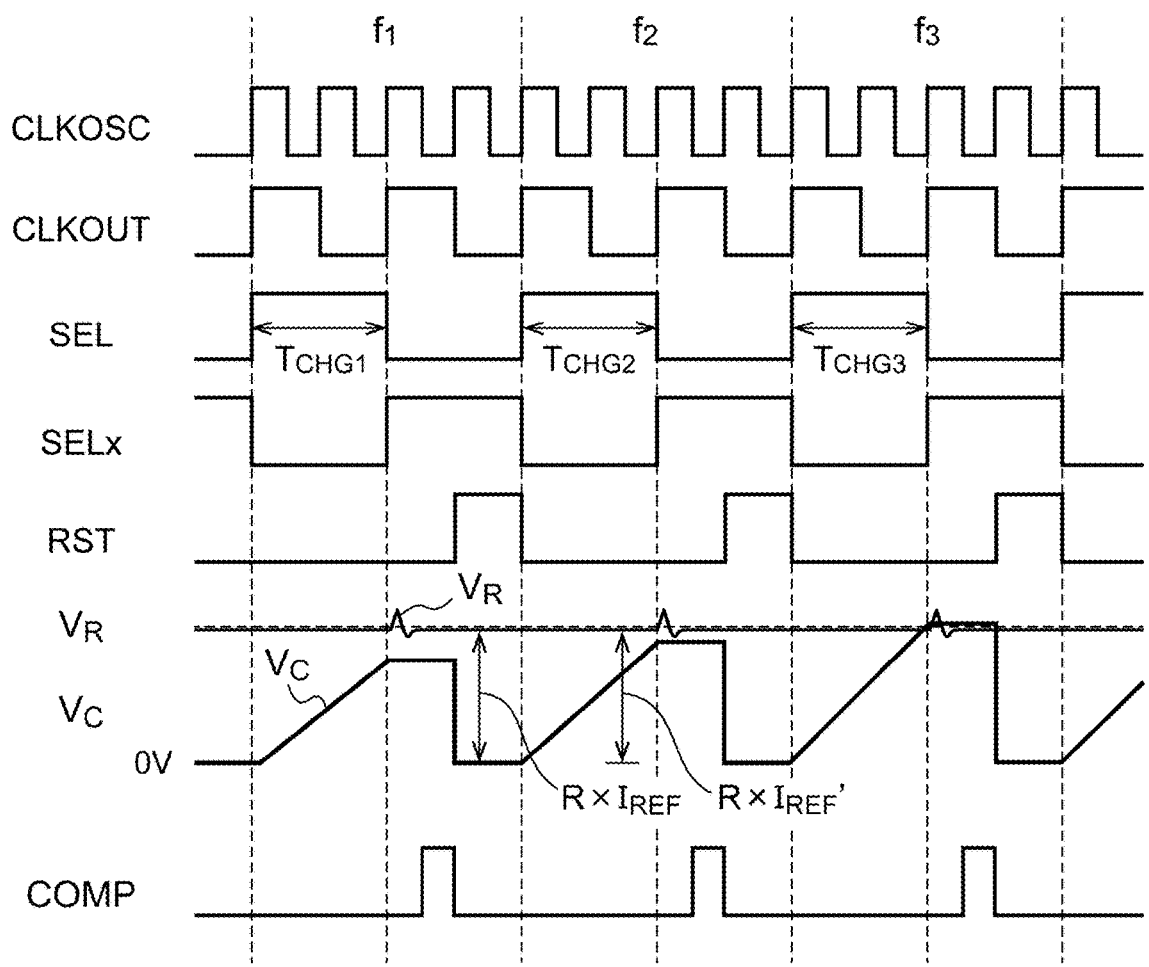
FIG. 7 is an operation waveform diagram of the oscillator circuit of FIG. 6.

FIG. 7 is an operation waveform diagram of the oscillator circuit 100C of FIG. 6. During the charging period $T_{CHG}$, the dummy current $I_{REF}'$ is supplied to the resistor R. Therefore, the reference voltage $V_R$ does not decrease to 0 V and maintains $I_{REF}' \times R$. When an SELx signal becomes high and a reference current $I_{REF2}$ is supplied to the resistor R, the reference voltage $V_R$ converges to a normal voltage level $R \times I_{REF2}$ in a short time.

As described above, according to the third embodiment, a fluctuation of the reference voltage $V_R$ can be suppressed. As a result, a restriction on a stabilization time of the reference voltage $V_R$ is relaxed, so that a higher-speed operation can be performed. Since the dummy current $I_{REF}'$ always flows, power consumption increases as compared to the second embodiment.

Fourth Embodiment

As described above, since an oscillation frequency of an oscillator circuit 100 is defined by capacitance of a capacitor C and a resistance value of a resistor R, an error occurs in the oscillation frequency when the capacitance C or the resistance R fluctuates due to process variations. In a fourth embodiment, frequency calibration will be described.

Figure 8:
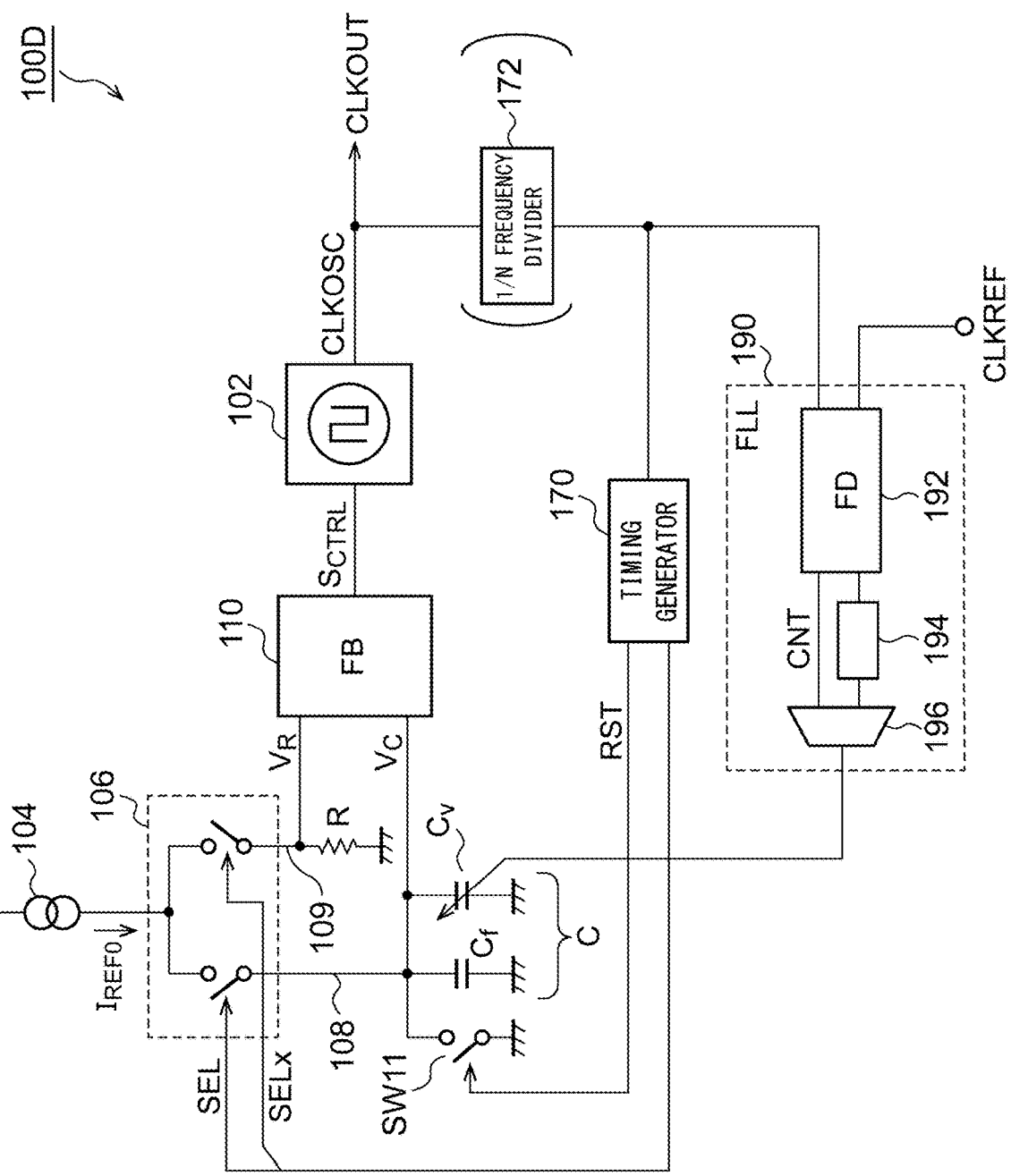
FIG. 8 is a circuit diagram of an oscillator circuit according to a fourth embodiment.

FIG. 8 is a circuit diagram of an oscillator circuit 100D according to the fourth embodiment. The frequency calibration is performed by finely adjusting the capacitance value of the capacitor C. The capacitor C includes a fixed capacitor Cf and a digitally controllable variable capacitor Cv. A configuration of the variable capacitor Cv is not particularly limited, and known technology may be used.

The oscillator circuit 100D includes a frequency locked loop (FLL) circuit 190. When the frequency calibration is performed, a reference clock CLKREF including no error is provided from the outside to the FLL circuit 190. The FLL circuit 190 generates a control code CNT according to a difference between frequencies of an output clock CLKOUT of the oscillator circuit 100, and changes a capacitance value of the variable capacitor Cv.

The FLL circuit 190 includes a frequency detector (FD: Frequency Detector) 192, a memory 194, and a selector 196. At the time of the calibration, the selector 196 selects an output of the frequency detector 192. The frequency detector 192 detects a difference between frequencies of the CLKOUT signal and the CLKREF signal, and increases or decreases the variable capacitance Cv according to the difference. Specifically, the control code CNT is changed so that the variable capacitance Cv becomes smaller when the frequency of the CLKOUT signal is lower, and the variable capacitance Cv becomes larger when the frequency of the CLKOUT signal is higher. By repeating the above operation, FLL is eventually locked, and the frequency of the CLKOUT signal is matched with the frequency of the reference clock CLKREF. The final control code CNT is written to the memory 194 and is held in a non-volatile manner. After the calibration is completed once, the selector 196 selects the control code CNT stored in the memory 194. Note that the resistance R may be directly calibrated instead of the variable capacitance Cv.

By adding the FLL circuit 190 as described above, accuracy of the frequency can be further improved.

Applications

Figure 9A:
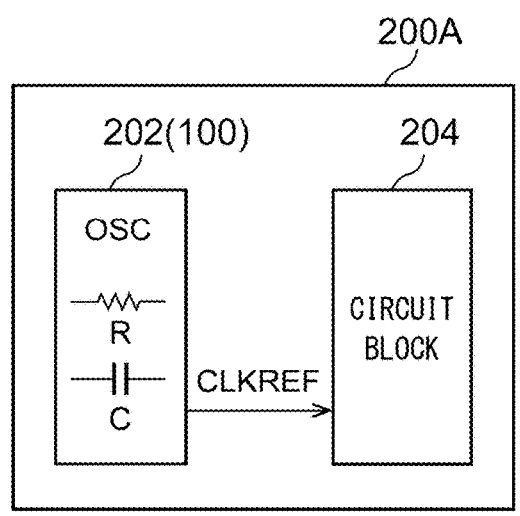
FIGS. 9A and 9B are diagrams illustrating a semiconductor device including an oscillator circuit.
Figure 9B:
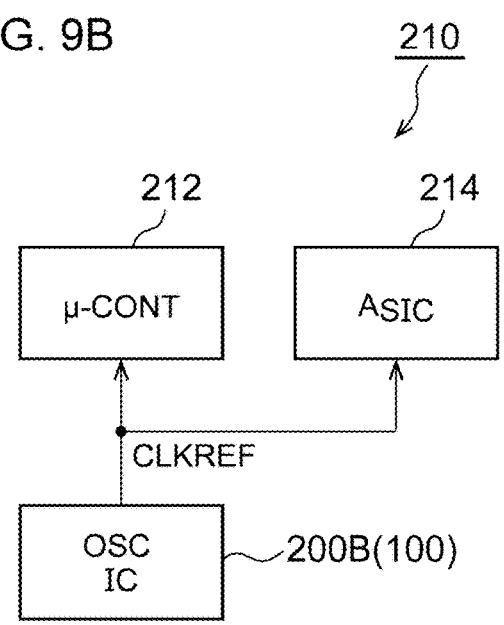

FIGS. 9A and 9B are diagrams illustrating a semiconductor device including the oscillator circuit 100. A semiconductor device 200A in FIG. 9A includes an oscillator 202 and a circuit block 204. The oscillator 202 is the above-described oscillator circuit 100, and generates a reference clock CLKREF having a frequency determined according to the capacitor C and the resistor R. The circuit block 204 may include (i) a logic circuit that performs arithmetic processing in synchronization with the reference clock CLKREF. Alternatively, the circuit block 204 may include (ii) a PLL circuit (frequency synthesizer) that multiplies the reference clock CLKREF and generates a radio frequency (RF) signal. The RF signal may be used as a clock for an A/D converter or a D/A converter. Alternatively, the circuit block 204 may include a modulator or a demodulator for wireless communication using the RF signal.

A semiconductor device 200B in FIG. 9B is a silicon oscillator IC including the oscillator circuit 100. The silicon oscillator IC is incorporated in a circuit system 210 as an alternative to a conventional crystal oscillator (CXO), and the reference clock CLKREF is supplied to a microcomputer 212, an application specific integrated circuit (ASIC) 214, and the like.

The present invention has been described on the basis of the embodiments. The embodiments are merely examples, and it is understood by those skilled in the art that various modifications can be made in the combination of the respective components or the respective processing processes, and that the modifications are also within the scope of the present invention. Hereinafter, the modifications will be described.

In the embodiment, the F/V conversion circuit 120 charges the capacitor C with the reference current $I_{REF1}$, and sets the voltage after charging as the detection voltage. However, the present invention is not limited thereto. On the contrary, the capacitor C may be discharged with the reference current $I_{REF}$, and the voltage after discharging may be set as the detection voltage $V_C$.

The waveforms and sequences of the timing signals SEL, RST, and COMP are merely examples, and the waveforms of the respective signals can be appropriately changed as long as the same operation is possible.

While the preferred embodiments of the present invention have been described using specific terms, such description is for illustrative purposes only, and it is to be understood that changes and variations may be made without departing from the spirit or scope of the appended claims.

What is claimed is:

1. An oscillator circuit comprising:
    a frequency variable oscillator structured to generate a clock having a frequency according to a voltage level of an analog control signal or a digital value of a digital control signal;
    a reference current source structured to generate a reference current;
    a path selector structured to distribute the reference current to a first path and a second path in a time-sharing manner in synchronization with the clock;
    an F/V conversion circuit including a capacitor connected to the first path and structured to charge or discharge the capacitor with the reference current and generate a detection voltage, wherein the detection voltage has a voltage level according to the frequency of the clock;
    a reference voltage source including a resistor connected to the second path and structured to output a reference voltage according to a voltage across the resistor; and
    a feedback circuit structured to adjust the voltage of the analog control signal or the digital value of the digital control signal so that the detection voltage approaches the reference voltage with a feedback manner.

2. The oscillator circuit according to claim 1, wherein the feedback circuit includes a clocked comparator structured to compare the reference voltage and the detection voltage in synchronization with the clock.

3. The oscillator circuit according to claim 2, wherein the frequency variable oscillator is a voltage controlled oscillator, and
the feedback circuit further includes a charge pump controlled by an up signal and a down signal according to an output of the clocked comparator.

4. The oscillator circuit according to claim 2, wherein the frequency variable oscillator is a digitally controlled oscillator, and
the feedback circuit further includes an up/down counter controlled by an up signal and a down signal according to an output of the clocked comparator.

5. The oscillator circuit according to claim 2, further comprising:
a timing generator structured to control the clocked comparator and the path selector on the basis of the clock.

6. The oscillator circuit according to claim 1, wherein the feedback circuit includes an error amplifier having an offset cancellation mechanism synchronized with the clock.

7. The oscillator circuit according to claim 1, further comprising:
a dummy current source structured to supply a dummy reference current to the second path during a period where the path selector distributes the reference current to the first path.

8. The oscillator circuit according to claim 1, wherein the capacitor includes a variable capacitor controlled according to a control code, and
the oscillator circuit further comprises:
a frequency locked loop (FLL) circuit structured to generate a control code so that the frequency of the clock approaches a frequency of a reference clock input from the outside; and
a memory structured to hold the control code in a state where the FLL circuit is locked, in a non-volatile manner.

9. A semiconductor device comprising:
the oscillator circuit according to claim 1; and
a circuit block structured to receive a clock generated by the oscillator circuit.

10. An oscillator integrated circuit (IC) comprising the oscillator circuit according to claim 1.

* * * * *